(12) United States Patent
Margomenos et al.

(10) Patent No.: US 9,093,394 B1
(45) Date of Patent: Jul. 28, 2015

(54) METHOD AND STRUCTURE FOR ENCAPSULATION AND INTERCONNECTION OF TRANSISTORS

(71) Applicant: HRL Laboratories, LLC, Malibu, CA (US)

(72) Inventors: Alexandros Margomenos, Pasadena, CA (US); Keisuke Shinohara, Thousand Oaks, CA (US); Dean C. Regan, Simi Valley, CA (US); Miroslav Micovic, Thousand Oaks, CA (US); Colleen M. Butler, Camarillo, CA (US)

(73) Assignee: HRL Laboratories, LLC, Malibu, CA (US)

( * ) Notice: Subject to any disclaimer, the term of this patent is extended or adjusted under 35 U.S.C. 154(b) by 0 days.

(21) Appl. No.: 14/107,943

(22) Filed: Dec. 16, 2013

(51) Int. Cl.
*H01L 21/44* (2006.01)
*H01L 23/31* (2006.01)
*H01L 21/56* (2006.01)
*H01L 29/66* (2006.01)
*H01L 29/778* (2006.01)

(52) U.S. Cl.
CPC ............ *H01L 23/3192* (2013.01); *H01L 21/56* (2013.01); *H01L 29/66431* (2013.01); *H01L 29/778* (2013.01)

(58) Field of Classification Search
CPC .............. H01L 21/56; H01L 21/28556; H01L 21/2633; H01L 21/0274; H01L 21/02129; H01L 29/0649; H01L 29/778; H01L 29/7781; H01L 31/03044
USPC ......... 438/598, 618, 142, 127, 513, 706, 602, 438/603, 604, 931; 257/412, E21.006, 257/E21.007, E21.009, E21.027, E21.054, 257/E21.126, E21.127, E21.17, E21.229, 257/E21.245, E21.267, E21.319, E21.327, 257/E21.37
See application file for complete search history.

(56) References Cited

U.S. PATENT DOCUMENTS

| 6,316,793 | B1* | 11/2001 | Sheppard et al. ............. 257/103 |
| 2007/0059873 | A1* | 3/2007 | Chini et al. .................... 438/199 |
| 2007/0164321 | A1* | 7/2007 | Sheppard et al. ............. 257/256 |
| 2012/0194276 | A1* | 8/2012 | Fisher .......................... 330/296 |

OTHER PUBLICATIONS

Shinohara, K. et al., "Scaling of GaN HEMTs and Schottky Diodes for Submillimeter-Wave MMIC Applications", IEEE Transactions of Electron Devices, Oct. 2013, vol. 60, No. 10, pp. 2892-2996.

(Continued)

*Primary Examiner* — David Nhu
(74) *Attorney, Agent, or Firm* — Ladas & Parry

(57) ABSTRACT

A semiconductor device comprises one or more transistors and two or more layers of dielectric material encapsulating a front side of said one or more transistors. The gate of each of said one or more transistors is located within a cavity, or air-box, in at least one of the dielectric layers, so that the gate terminal is physically separated from said dielectric material. Such an arrangement may reduce parasitic capacitance. In another arrangement, a semiconductor device comprises one or more gallium nitride high electron mobility transistors and one or more dielectric layers encapsulating a front side of said one or more transistors, wherein the gate terminal of each of said one or more transistors is located within a cavity in at least one of the one or more dielectric layers, separated from said dielectric material.

11 Claims, 6 Drawing Sheets

(56) References Cited

OTHER PUBLICATIONS

Takahashi, T. et al., "Improvement of RF and Noise Characteristics Using a Cavity Structure in InAlAs/InGaAs HEMTs", IEEE Transactions on Electron Devices, Aug. 2012, vol. 59, No. 8, pp. 2136-2141.

Takahashi, T. et al., "Improvement in High Frequency and Noise Characteristics of InP-Based HEMTs by Reducing Parasitic Capacitance" in Proceedings of IEEE 20$^{th}$ International Conference on Indium Phosphide and Related Materials, May 2008, p. MoA 3.4.

* cited by examiner

METHOD AND STRUCTURE FOR ENCAPSULATION AND INTERCONNECTION OF TRANSISTORS

STATEMENT REGARDING FEDERAL FUNDING

This invention was made under U.S. Government Contract No. HR0011-09-C-0126. The U.S. Government has certain rights in this invention.

CROSS-REFERENCE TO RELATED APPLICATIONS

None.

TECHNICAL FIELD

This disclosure relates to transistors and methods of encapsulation and manufacture thereof.

BACKGROUND

High frequency active circuits, designed to operate at a frequency above 50 GHz, may be vulnerable to damage for a number of reasons. Such circuits may include features with extremely small physical dimensions, such as a few nanometers, that may be fragile, especially in areas around transistor gates. In addition, interconnects and passive components, such as capacitors and thin-film resistors, on a front-side of a circuit may be sensitive to scratches. Therefore, such circuits are at risk of damage when handled during packaging and assembly. Also, the front-side of the circuit may be exposed to humidity and other environmental conditions that may cause performance degradation or accelerate failure of active components.

Encapsulation, or passivation, has been used to provide some physical protection for active areas, interconnects and passive components on the front-sides of micro-electronic chips, using a layer or coating of a material having a higher dielectric constant than air. Examples of dielectric materials used for this purpose include BCB (benzocyclobutene), spin-on glass and polyimide. The protective dielectric material can also be used to provide mechanical support for multi-layer interconnects, allowing additional flexibility in the design of the circuit. However, the presence of dielectric material around gates of components of the circuit causes parasitic capacitance to increase. Parasitic capacitance can cause a significant degradation in the performance of the circuit, particularly at high frequencies, potentially affecting one or more of gain, frequency drift, noise, output power and power-added efficiency. For example, a GaN (gallium nitride) amplifier encapsulated with BCB can show a deterioration of approximately 1.5 dB in small signal gain and a shift in operational frequency of 10-15%, when compared with an unencapsulated amplifier that is otherwise identical. Such decreased performance can occur even where a low-loss dielectric material is used for encapsulation.

Therefore, the protection and flexibility provided by conventional methods is offset by a decrease in the performance of the circuit. In low frequency circuits, operating below 30 GHz, the benefits may outweigh the degradation in performance. However, at higher frequencies, above 30 GHz, the reduction in gain, output power and efficiency of the circuit can be problematical. Hence, the usefulness of conventional dielectric encapsulation and passivation protection methods for high frequency circuits is limited.

SUMMARY

Embodiments of the present disclosure may include a semiconductor device including a substrate and one or more transistors mounted on said substrate, each of said one or more transistors having a respective gate terminal. Two or more layers of dielectric material encapsulate a front side of said one or more transistors, at least one of said two or more layers of dielectric material having one or more cavities. The gate terminal of each of said one or more transistors is located within one of said one or more cavities, separated from said at least one layer of dielectric material.

Such a semiconductor device may include two or more interconnects, where a first one of said interconnects is supported by a first one of said layers of dielectric material and a second one of said interconnects being supported by a second one of said layers of dielectric material.

The one or more transistors may include a gallium nitride high electron mobility transistor.

In some embodiments, the semiconductor device may form part of a device such as a power amplifier, low noise amplifier, mixer, switch, phase-shifter or variable attenuator. Alternatively, or additionally, the semiconductor device may form part of a submillimeter-wave circuit or mixed signal circuit.

In another embodiment, a semiconductor device includes a substrate and one or more gallium nitride high electron mobility transistors mounted on said substrate, each of said one or more transistors having a respective gate terminal. One or more layers of dielectric material encapsulate a front side of said one or more transistors, at least one of said one or more layers of dielectric material having one or more cavities. The gate terminal of each of said one or more transistors is located within a respective one of said one or more cavities and separated from said at least one layer of dielectric material.

In other embodiments, a device such as a power amplifier, low noise amplifier, mixer, switch, phase-shifter or variable attenuator or a circuit, such as a sub-millimeter wave circuit or a mixed signal circuit, includes said semiconductor device.

In yet another embodiment, a method of encapsulating a semiconductor device includes mounting one or more transistors on a substrate, each of said one or more transistors having a respective gate terminal, applying two or more layers of dielectric material encapsulating a front side of said one or more transistors, and forming one or more cavities in at least one of said two or more layers of dielectric material, where said one or more cavities are located around a gate terminal of said one or more transistors to separate said gate terminal from said two or more layers of dielectric material.

In such a method, said forming one or more cavities might include, before applying a first one of said two or more layers of dielectric material, applying a layer of sacrificial material over active areas of said one or more transistors, and after applying said two or more layers of dielectric material, etching said layers of dielectric material to provide access to said layer of sacrificial material, and removing said layer of sacrificial material.

In certain embodiments, the method further includes, after applying a first one of said two or more layers of dielectric material and before applying a second one of said two or more layers of dielectric material, forming one or more interconnects supported by said first layer of dielectric material and, optionally, may further include, after applying a second one of said two or more layers of dielectric material, forming one or more interconnects supported by said second layer of dielectric material. In an example where interconnects are supported by the first and second layers of dielectric material, forming said one or more interconnects supported by said first layer of dielectric material may include dry-etching said first layer of dielectric material, and forming said one or more interconnects supported by said second layer of dielectric material may include photo-etching said second layer of dielectric material.

In a further embodiment, a method of encapsulating a semiconductor device includes mounting one or more gallium nitride high electron mobility transistors on a substrate, each of said one or more transistors having a respective gate terminal. One or more layers of dielectric material are applied to encapsulate, or passivate, a front side of said one or more transistors. Then, one or more cavities in at least one of said one or more layers of dielectric material, where said one or more cavities are located around a gate terminal of said one or more transistors to separate said gate terminal from said one or more layers of dielectric material.

These and other features and advantages will become further apparent from the detailed description of example embodiments that follows and the accompanying figures.

DETAILED DESCRIPTION

In the figures and the following description, numerals indicate various features, like numerals referring to like features throughout both the drawings and description.

Figure 1:
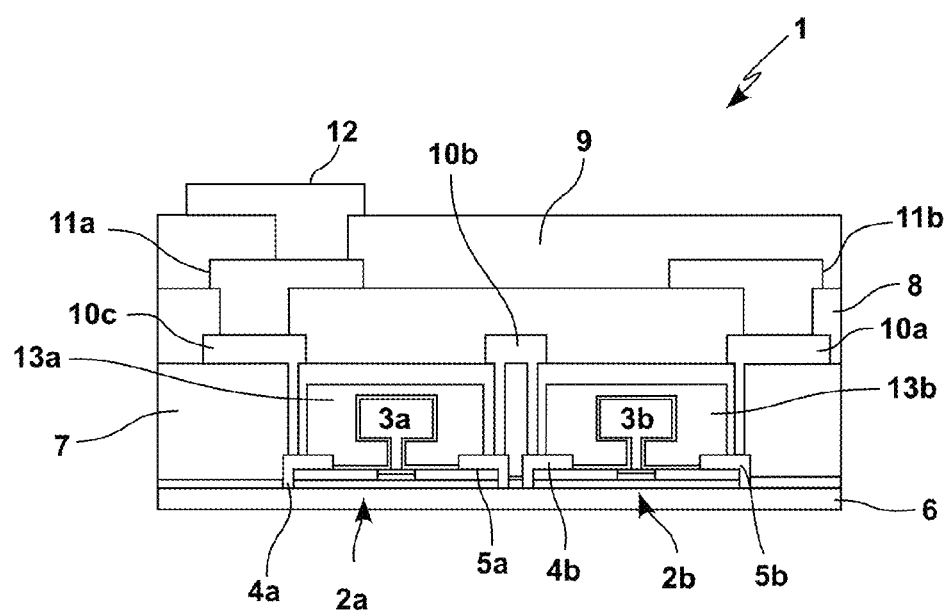
FIG. 1 depicts a device according to an embodiment.

FIG. 1 depicts a device 1, such as an IC (integrated circuit) chip according to an embodiment. In this particular example, the device 1 includes at least two transistors 2a, 2b, of which the respective gate terminals 3a, 3b, source terminals 4a, 4b and drain terminals 5a, 5b are shown, mounted on a substrate 6. For example, the first transistor 2a may be a D-mode (depletion mode) GaN HEMT and the second transistor 2b may be an E-mode (enhancement mode) GaN HEMT, while the substrate 6 is formed of SiC (silicon carbide).

The front-side of the transistors 2a, 2b are encapsulated with at least one layer of dielectric material. In this particular example, three dielectric layers 7, 8, 9 are present. In addition to providing physical protection for the front-sides of the transistors 2a, 2b, the dielectric layers 7, 8, 9 can also be used provide mechanical support for metal interconnects 10a, 10b, 10c, 11a, 11b, 12 at one or more levels within the device 1. In the example embodiment depicted in FIG. 1, the dielectric layers 7, 8, 9 are used to support interconnects 10a, 10b, 10c, 11a, 11b, 12 at three different levels in the device 1. The provision of interconnects at multiple levels can allow scaling, so that the overall physical dimensions of the device 1 can be made relatively small.

The active areas of the transistors 2a, 2b are separated from the material of the dielectric layers 7, 8, 9. In this example, a cavity 13a, 13b is provided in a first one of the dielectric layers 7 to provide such separation, by forming an "air-box" around the gate terminals 3a, 3b of the individual transistors 2a, 2b. Since the gate terminals 3a, 3b are separated from the dielectric layers 7, 8, 9, parasitic capacitance between the gate terminals 3a, 3b and the source terminals 4a, 4b and/or between the gate terminals 3a, 3b and the drain terminals 5a, 5b of the respective transistors 2a, 2b can be reduced, when compared with encapsulated devices without cavities.

Figure 2:
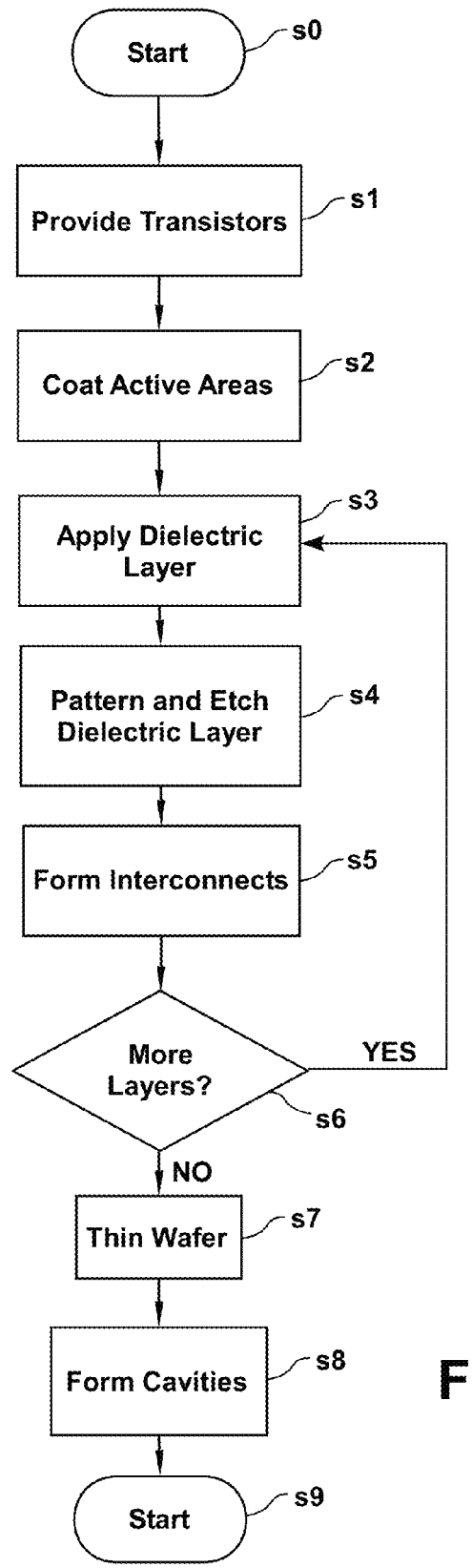
FIG. 2 is a flowchart of an encapsulation method for use in manufacture of the device of FIG. 1.

An encapsulation method for use in manufacturing the device 1 will now be described with reference to the flowchart of FIG. 2 and to FIGS. 3 to 7, beginning at step s0. The transistors 2a, 2b are provided on a SiC wafer 6' (step s1). An example of a method of fabricating GaN HEMTs is disclosed in K. Shinohara et al., "*Scaling of GaN HEMTs and Schottky Diodes for Submillimeter-Wave MMIC Applications*", IEEE Transactions of Electron Devices, October 2013, the disclosure of which is incorporated herein by reference in its entirety.

Figure 3:
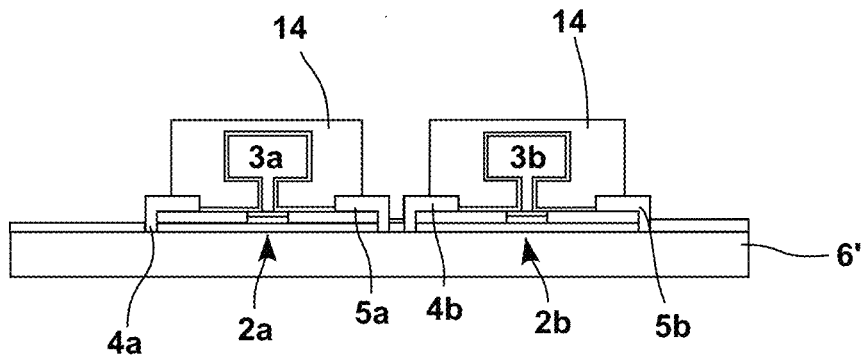
FIGS. 3 to 8 depict stages in the encapsulation of the device of FIG. 1 using the method shown in FIG. 2.

The active areas of the transistors 2a, 2b are coated with a layer 14 of sacrificial material (step s2), as shown in FIG. 3. In this example, the sacrificial layer 14 is formed of a photo-resist, such as PMGI (polymethylglutarimide), spun-coated on the substrate 6 and having a thickness of approximately 2 microns.

The first dielectric layer 7 is then applied over the front-side of the transistors 2a, 2b, covering the sacrificial layer 14 (step s3). In this particular example, the first dielectric layer 7 is formed of BCB and deposited using spin-on coating.

Figure 4:
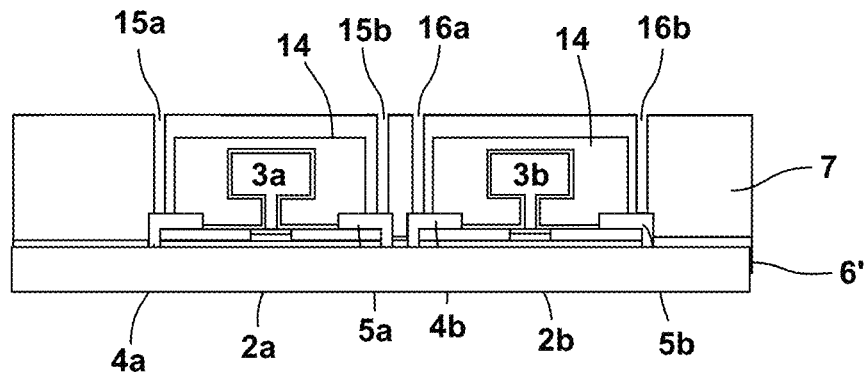
Figure 5:
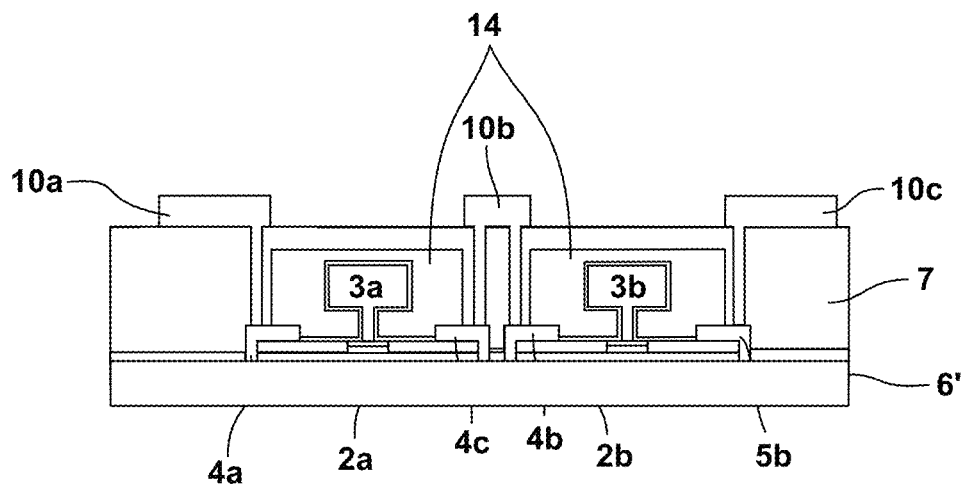

The first dielectric layer 7 is then patterned and etched (step s4) to provide vias 15a, 15b, 16a, 16b, shown in FIG. 4, for example using a RIE (reactive-ion etching) tool. A metallization process is then used to form a first set of interconnects 10a, 10b, 10c by partially filling those vias 15a, 15b, 16a, 16b (step s5), as shown in FIG. 5. In this particular example, the first dielectric layer is a BCB coating of approximately 3 microns in thickness, deposited using spin-coating, and dry etched to provide the vias 15a, 15b, 16a, 16b and the interconnects 10a, 10b, 10c are formed by Au (gold) metallization.

Where the further dielectric layers are to be added to the device, for example, to provide interconnects at more levels (step s6), the steps of applying and etching a dielectric layer 8, 9 (steps s4 and s5) and forming interconnects 11a, 11b, 12 (step s6) is repeated for each further dielectric layer 8, 9. In this particular example, the further dielectric layers 8, 9 are provided in the form of spin-on BCB coatings of approximately 3 microns in thickness.

Figure 6:
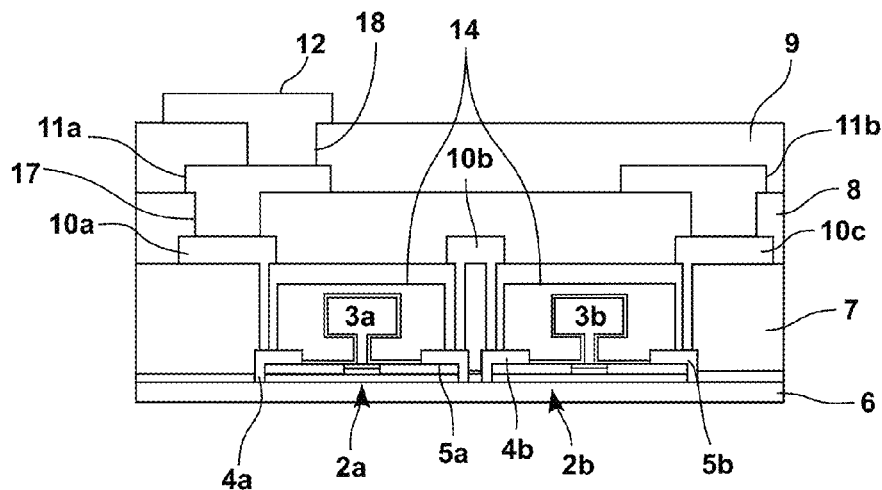

Each further dielectric layers 8, 9 is, in turn, deposited, cured, patterned and etched, in turn, to form further vias, 17a, 17b, 18 (steps s4 and s5). Since tolerances for the positioning of the interconnects 11a, 11b, 12 in the further dielectric layers 8, 9 is greater than the tolerance for the position of the interconnects 10 in the first dielectric layer 7, photo-etching may be used to define the vias 17a, 17b, 18 instead of dry-etching in step s5. Further interconnects 11a, 11b, 12 are then formed using a process such as sputtering and electroplating (step s6). FIG. 6 depicts the device 1 following the application of second and third dielectric layers 8, 9 and the formation of the further interconnects 11, 12 thereon.

After the required number of dielectric layers 7, 8, 9 and interconnects 10, 11, 12 have been formed (step s6), the wafer 6' may then be thinned to form the substrate 6 (step s7). In this particular example, the wafer 6' is thinned to a thickness of 50 microns. Also, if required, backside vias (not shown) can be formed through the wafer 6' at this stage.

Figure 7:
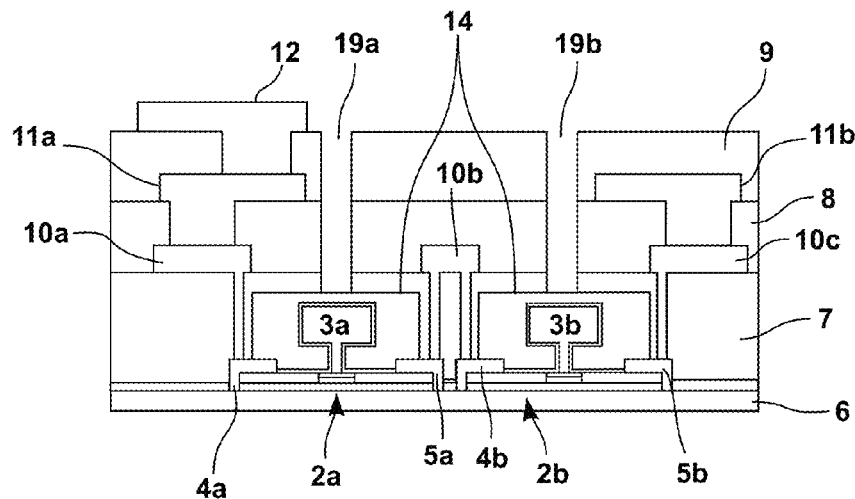
Figure 8:
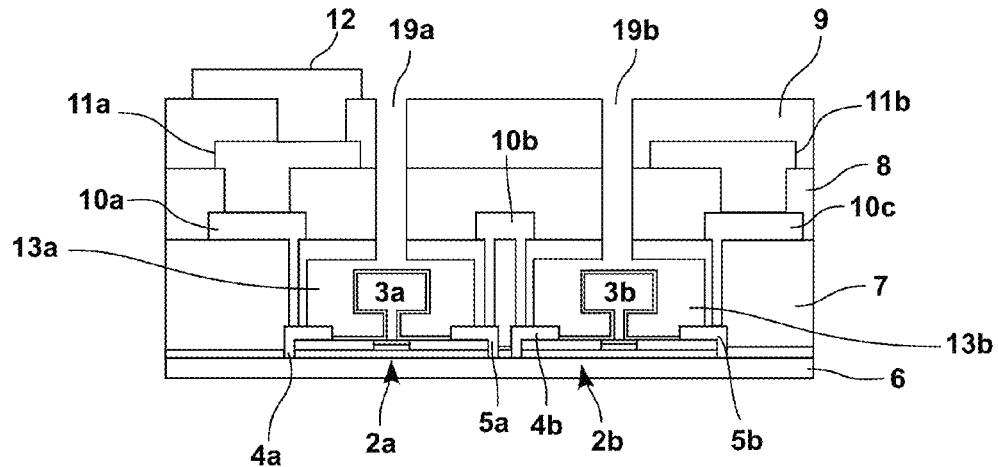

The cavities 13a, 13b are then formed by removing the layer 14 of sacrificial material covering the active areas of the transistors 2a, 2b (step s8), to complete the encapsulation method (step s9). In this particular example, a hard mask (not shown) is placed over the device 1 and vias 19a, 19b, shown in FIGS. 7 and 8, are formed in the dielectric layers 7, 8, 9 using a dry-etching technique such as RIE, to provide access to the layer 14 of sacrificial material covering the active areas. The layer 14 of sacrificial material is then removed using a developer, solvent or other chemical formulation, to form the cavities 13a, 13b around the gate terminals 3a, 3b, to produce the device 1 as shown in FIGS. 1 and 8, where FIG. 8 shows a cross-section of the device through the vias 19a, 19b.

Figure 9:
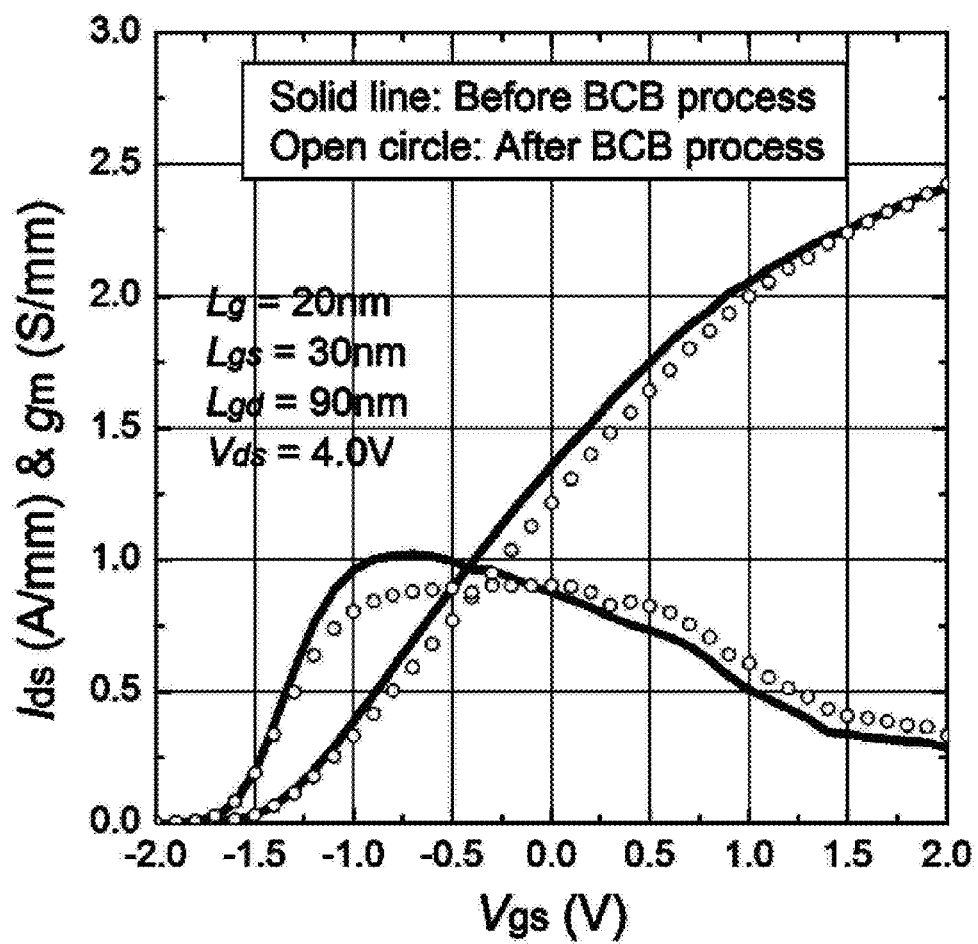
FIG. 9 is a graph comparing DC characteristics of a GaN HEMT that has been encapsulated according to an embodiment and an unencapsulated GaN HEMT.
Figure 10:
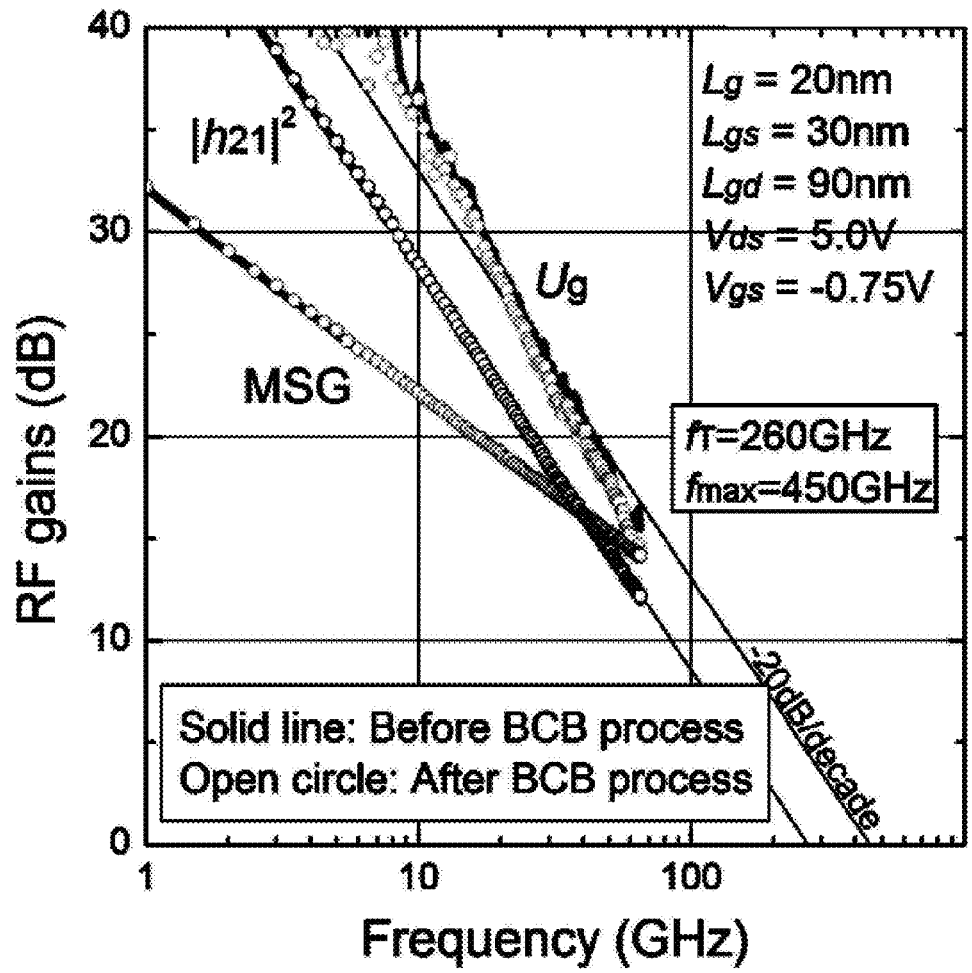
FIG. 10 is a graph comparing RF characteristics of a GaN HEMT that has been encapsulated according to an embodiment and an unencapsulated GaN HEMT.

FIGS. 9 and 10 show DC and RF characteristics respectively, for a GaN HEMT with multi-level interconnects such as the transistor 2a in FIG. 1. FIG. 9 is a graph showing variation of the transductance $g_m$ of the transistor 2a and the current $I_{ds}$ between the drain terminal 5a and the source terminal 4a against the voltage $V_{gs}$ between the gate terminal 3a and the source terminal 4a for an example where the gate length $L_{gd}$ is 20 nm, the gate-to-source overlap $L_{gs}$ is 30 nm, the gate-to-drain overlap $L_{gd}$ is 90 nm and the voltage $V_{ds}$ between the drain terminal 5a and the source terminal 4a is 4.0 V. FIG. 10 is a graph showing the maximum stable gain (MSG) and unilateral gain ($U_g$) of the same GaN HEMT structure at radio frequencies, where the voltage $V_{ds}$ between the drain terminal 5a and the source terminal 4a is 5.0 V and the voltage $V_{gs}$ between the gate terminal 3a and the source terminal 4a is –0.75 V.

In both FIGS. 9 and 10, the values for the GaN HEMT, before encapsulation, are indicated by a solid line, while the values for the GaN HEMT after encapsulation with a cavity 13a are indicated by open circles. As shown by FIGS. 9 and 10, the changes in the DC and RF characteristics of the GaN HEMT caused by encapsulation may be insignificant. In particular, in the example shown in FIG. 9, the differences in cut-off frequency $f_T$ and maximum oscillation frequency $f_{max}$ between the encapsulated GaN HEMT and the unencapsulated GaN HEMT appear to be negligible. Hence, in this example, the performance of the GaN HEMT is largely unaffected by multi-layer encapsulation by the method of FIG. 2, where the presence of the cavity 13a prevents a significant increase in the parasitic capacitances of the gate terminal 3a.

Figure 11:
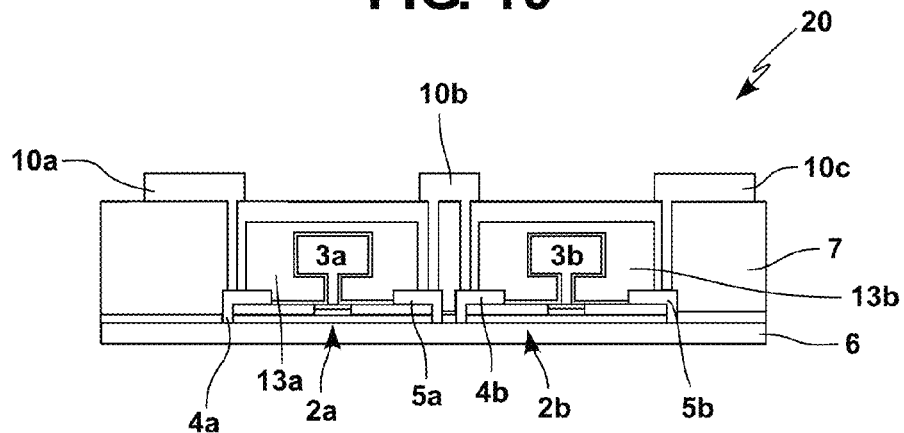
FIG. 11 depicts an encapsulated semiconductor device according to another embodiment.

FIG. 11 depicts a semiconductor device 20 according to another embodiment in which two GaN HEMTs 2a, 2b are encapsulated by a single dielectric layer 7 and interconnects 10a, 10b, 10c are supported by the single dielectric layer 7 at one level. Such a semiconductor device 20 may be provided by a method as shown in FIG. 2, without repetition of steps s4, s5 and s6 discussed hereinabove.

Embodiments of the present disclosure may provide methods for providing at least some of the advantages of dielectric encapsulation while reducing, or even avoiding, the performance degradation associated with conventional encapsulation techniques. Where multi-layer encapsulation is used, the dielectric layers 7, 8, 9 can be used to support interconnects 10a, 10b, 10c, 11a, 11b, 12 at multiple levels, facilitating scaling of devices 1 and increasing multi-functionality and improving flexibility when interconnecting between multiple devices 1. Where the overall size of the device 1 is reduced, the cost of the device may also decrease.

Embodiments of the present disclosure may be particularly beneficial in active devices operating at high speed or at high frequencies, above 50 GHz, such as G-band frequencies (110-300 GHz), where performance degradation due to parasitic capacitances may be particularly marked. For example, the use of highly-scaled GaN HEMTs in submillimeter-wave and mixed signal circuits, power amplifiers, low noise amplifiers, mixers, switches, phase shifters, variable attenuators and so on, may be facilitated by using embodiments of the encapsulation method.

Encapsulation methods according to particular embodiments may be compatible with GaN T2, T3 and T4 processes.

In the embodiments described above, the sensitive active areas of the transistors 2a, 2b and at least some of the interconnects 10a, 10b, 10c, 11a, 11b, 12 are protected by one or more dielectric layers 7, 8, 9. Protected chips are easier to handle during mounting and assembly of electronic devices, for example, where tweezers of vacuum wands are used to hold and manipulate the chips.

Also, depending on the details and type of the dielectric encapsulation, the embodiments can provide a hermetic or near-hermetic environment for the active areas of the transistors 2a, 2b, protecting the transistors 2a, 2b from some adverse environmental conditions. This can improve the long-term reliability of the device 1 and, also, allows greater freedom in a next level of packaging of the device 1.

The foregoing description of embodiments is presented for the purposes of illustration only. It is not intended to be exhaustive or to limit the disclosure to the precise form of the examples disclosed. For example, while the example embodiments disclosed with reference to FIGS. 1 and 3 to 8 and to FIG. 11 have two GaN HEMT transistors 2a, 2b, embodiments may have other numbers, or types, of active devices.

While FIGS. 1 and 11 depict embodiments in which transistors 2a, 2b are located within respective cavities 13a, 13b in a first dielectric layer 7, other embodiments may be envisaged in which more than one transistor is located within one cavity and/or where a cavity extends into more than one dielectric layer 7, 8, 9.

FIGS. 1 and 11 depict embodiments in which three dielectric layers 7, 8, 9 and one dielectric layer 7 are provided respectively, with interconnects 10a, 10b, 10c, 11a, 11b, 12 provided on a corresponding number of levels. Other embodiments may have different numbers of dielectric layers and/or levels of interconnects.

The example embodiments shown in FIGS. 1 and 11 have a SiC substrate, gold interconnects and one or more dielectric layers 7, 8, 9 formed of BCB. However, in other embodiments, alternative materials may be used for some or all of these components. Examples of other suitable materials for the one or more dielectric layers 7, 8, 9 include spin-on glass, silicon nitride (SiN), polyimide, and so on, while suitable materials for forming some or all of the interconnects include copper. Further, other techniques may be used to deposit and/or define the layer 14 of sacrificial material and the one or more dielectric layers 7, 8, 9 than those discussed above in regard to FIG. 2, such as plasma-enhanced chemical vapor deposition (PECVD).

Other modifications and variations to the above embodiments will be apparent to persons skilled in the art, and the method steps described above might be interchangeable with other steps to achieve the same result. It is intended that the scope of the disclosure be interpreted with reference to the claims appended hereto and their equivalents.

Reference to an element in the singular hereinabove is not intended to mean "one and only one" unless explicitly so stated, but rather "one or more". Moreover, no element, component or method step in the present disclosure is intended to be dedicated to the public, regardless of whether the element, component or method step is explicitly recited in the accompanying claims. No claim element herein is to be construed under the provisions of 35 U.S.C. §112, sixth paragraph, unless the element is expressly recited using the phrase "means for . . . ".

The invention claimed is:

1. A semiconductor device comprising:
   a substrate;
   one or more transistors mounted on said substrate, each of said one or more transistors having a respective gate terminal;
   two or more layers of dielectric material encapsulating a front side of said one or more transistors, at least one of said two or more layers of dielectric material comprising one or more cavities;
   wherein the respective gate terminal of each of said one or more transistors is located within one of said one or more cavities and physically separated from said at least one layer of dielectric material.

2. A semiconductor device according to claim 1, further comprising two or more interconnects electrically coupled to said one or more transistors, a first one of said interconnects being supported by a first one of said layers of dielectric material and a second one of said interconnects being supported by a second one of said layers of dielectric material.

3. A semiconductor device according to claim 1, wherein said one or more transistors is a gallium nitride high electron mobility transistor.

4. A method of encapsulating a semiconductor device comprising:
   mounting one or more transistors on a substrate, each of said one or more transistors having a respective gate terminal;
   applying two or more layers of dielectric material encapsulating a front side of said one or more transistors;
   forming one or more cavities in at least one of said two or more layers of dielectric material, wherein said one or more cavities are located around a gate terminal of said one or more transistors to separate said gate terminal from said two or more layers of dielectric material.

5. A method according to claim 4, wherein:
   said forming one or more cavities comprises:
      before applying a first one of said two or more layers of dielectric material, applying a layer of sacrificial material over active areas of said one or more transistors; and
      after applying said two or more layers of dielectric material, etching said layers of dielectric material to provide access to said layer of sacrificial material and removing said layer of sacrificial material.

6. A method according to claim 4, further comprising:
   after applying a first one of said two or more layers of dielectric material and before applying a second one of said two or more layers of dielectric material, forming one or more interconnects supported by said first layer of dielectric material.

7. A method according to claim 5, further comprising: after applying a second one of said two or more layers of dielectric material, forming one or more interconnects supported by said second layer of dielectric material.

8. A method according to claim 7, wherein:
   forming said one or more interconnects supported by said first layer of dielectric material comprises dry-etching said first layer of dielectric material; and forming said one or more interconnects supported by said second layer of dielectric material comprises photo-etching said second layer of dielectric material.

9. A semiconductor device comprising:
   a substrate;
   one or more transistors mounted on said substrate, each of said one or more transistors having a respective gate terminal;
   two or more layers of dielectric material encapsulating a front side of said one or more transistors, at least one of said two or more layers of dielectric material comprising one or more cavities;
   two or more interconnects, electrically coupled to the one or more transistors;
   wherein:
      the respective gate terminal of each of said one or more transistors is located within a respective one of said one or more cavities and separated from said at least one layer of dielectric material;
      a first one of said interconnects being supported by a first one of said layers of dielectric material; and
      a second one of said interconnects being supported by a second one of said layers of dielectric material.

10. A semiconductor device comprising:
    a substrate;
    one or more gallium nitride high electron mobility transistors mounted on said substrate, each of said one or more transistors having a respective gate terminal;
    one or more layers of dielectric material encapsulating a front side of said one or more transistors, at least one of said one or more layers of dielectric material comprising one or more cavities;
    wherein the respective gate terminal of each of said one or more gallium nitride high electron mobility transistors is located within one of said one or more cavities and separated from said at least one layer of dielectric material.

11. A method of encapsulating a semiconductor device comprising:
    mounting one or more gallium nitride high electron mobility transistors on a substrate, each of said one or more transistors having a respective gate terminal;
    applying one or more layers of dielectric material encapsulating a front side of said one or more transistors;
    forming one or more cavities in at least one of said one or more layers of dielectric material, wherein said one or more cavities are located around a gate terminal of said one or more gallium nitride high electron mobility transistors to separate said gate terminal from said one or more layers of dielectric material.

* * * * *